United States Patent
Moon et al.

(10) Patent No.: US 10,522,697 B2
(45) Date of Patent: Dec. 31, 2019

(54) COMPOSITION FOR FORMING ELECTRODE, ELECTRODE MANUFACTURED USING THE SAME AND SOLAR CELL

(71) Applicant: Samsung SDI Co., Ltd., Yongin-si, Gyeonggi-do (KR)

(72) Inventors: Sungil Moon, Suwon-si (KR); Kyoungjin Ha, Suwon-si (KR); Hansong Lee, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 16/033,779

(22) Filed: Jul. 12, 2018

(65) Prior Publication Data

US 2019/0198689 A1 Jun. 27, 2019

(30) Foreign Application Priority Data

Dec. 22, 2017 (KR) .................. 10-2017-0178798

(51) Int. Cl.
| | | |
|---|---|---|
| H01L 31/0224 | (2006.01) | |
| H01B 1/22 | (2006.01) | |
| C03C 4/14 | (2006.01) | |
| C03C 8/18 | (2006.01) | |
| C03C 8/02 | (2006.01) | |
| C03C 14/00 | (2006.01) | |
| H01L 31/0216 | (2014.01) | |

(52) U.S. Cl.
CPC ........ *H01L 31/022425* (2013.01); *C03C 4/14* (2013.01); *C03C 8/02* (2013.01); *C03C 8/18* (2013.01); *C03C 14/004* (2013.01); *H01B 1/22* (2013.01); *C03C 2204/00* (2013.01); *C03C 2205/00* (2013.01); *C03C 2214/08* (2013.01); *H01L 31/02167* (2013.01)

(58) Field of Classification Search
CPC ..... H01L 31/022425; C03C 4/14; C03C 8/02; C03C 8/18; H01B 1/22
See application file for complete search history.

(56) References Cited

U.S. PATENT DOCUMENTS

| | | | |
|---|---|---|---|
| 9,246,027 B2 | 1/2016 | Ito et al. | |
| 2014/0352774 A1* | 12/2014 | Ito | C03C 8/18 |
| | | | 136/256 |
| 2016/0049540 A1* | 2/2016 | Kapur | H01L 31/068 |
| | | | 136/256 |

FOREIGN PATENT DOCUMENTS

| | | | |
|---|---|---|---|
| JP | 2001-072767 A | 3/2001 | |
| JP | 2013-077515 A | 4/2013 | |
| JP | 5918090 B2 | 5/2016 | |
| KR | 10-2013-0110960 A | 10/2013 | |
| KR | 10-2017-0044128 A | 4/2017 | |

* cited by examiner

*Primary Examiner* — Jayne L Mershon
(74) *Attorney, Agent, or Firm* — Lee & Morse, P.C.

(57) ABSTRACT

A composition for forming an electrode for a solar cell includes a conductive powder, a glass frit, and an organic vehicle, the organic vehicle including a thickener including a structural unit represented by Chemical Formula 1,

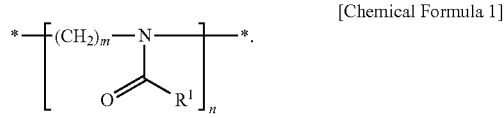

[Chemical Formula 1]

15 Claims, 1 Drawing Sheet

COMPOSITION FOR FORMING ELECTRODE, ELECTRODE MANUFACTURED USING THE SAME AND SOLAR CELL

CROSS-REFERENCE TO RELATED APPLICATION

Korean Patent Application No. 10-2017-0178798 filed on Dec. 22, 2017, in the Korean Intellectual Property Office, and entitled: "Composition for Forming Electrode, Electrode Manufactured using the Same and Solar Cell," is incorporated by reference herein in its entirety.

BACKGROUND

1. Field

Embodiments relate to a composition for forming an electrode, an electrode manufactured using the same, and a solar cell.

2. Description of the Related Art

Solar cells generate electrical energy using the photovoltaic effect of a p-n junction that converts photons of sunlight into electricity. In a solar cell, front and rear electrodes may be formed respectively on front and rear surfaces of a semiconductor substrate (for example, a semiconductor wafer) having the p-n junction. A photovoltaic effect of the p-n junction is induced by sunlight entering the substrate and electrons generated by the photovoltaic effect of the p-n junction provide an electric current to the outside through the electrodes.

SUMMARY

Embodiments are directed to a composition for forming an electrode for a solar cell, the composition including a conductive powder, a glass frit, and an organic vehicle, the organic vehicle including a thickener including a structural unit represented by Chemical Formula 1:

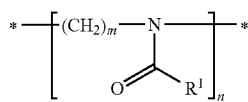

[Chemical Formula 1]

In Chemical Formula 1,
$R^1$ may be a substituted or unsubstituted C2 to C30 alkyl group,
m may be an integer ranging from 1 to 3, and
n may be an integer ranging from 1 to 5.
$R^1$ may be a substituted or unsubstituted C8 to C30 alkyl group.
n may be an integer ranging from 2 to 5.
The thickener may be included in an amount of about 0.2 wt % to about 0.3 wt % based on a total weight of the composition.
The organic vehicle may further include a binder resin and a solvent.
The binder resin may include one or more of a cellulose-based compound, a polyvinylacetal compound, or an acryl-based compound.

The binder resin may have a weight average molecular weight of about 5,000 g/mol to about 200,000 g/mol.
The solvent may include one or more of methylcellosolve, ethyl cellosolve, butyl cellosolve, aliphatic alcohol, α-terpineol, β-terpineol, dihydro-terpineol, ethylene glycol, ethylene glycol mono butyl ether, butyl cellosolve acetate, or 2,2,4-trimethyl-1,3-pentanediol isobutyrate.
The conductive powder may be a silver powder.
The composition may include about 60 wt % to about 95 wt % of the conductive powder; about 0.5 wt % to about 20 wt % of the glass frit; and about 0.1 wt % to about 20 wt % of the organic vehicle.
The glass frit may include one or more of lead, tellurium, bismuth, lithium, phosphorus, germanium, gallium, cerium, iron, silicon, zinc, tungsten, magnesium, cesium, strontium, molybdenum, titanium, tin, indium, vanadium, barium, nickel, copper, sodium, potassium, arsenic, cobalt, zirconium, manganese, and aluminum.
The composition may further include one or more of a surface-treatment agent, a dispersing agent, a thixotropic agent, a plasticizer, an antifoaming agent, a pigment, an ultraviolet stabilizer, an antioxidant, or a coupling agent.
Embodiments are also directed to a solar cell electrode manufactured using a composition according to an embodiment.
Embodiments are also directed to a solar cell including an electrode according to an embodiment.
The solar cell may have a passivated emitter and rear cell structure.

BRIEF DESCRIPTION OF THE DRAWINGS

Features will become apparent to those of skill in the art by describing in detail example embodiments with reference to the attached drawings in which.

DETAILED DESCRIPTION

Figure 1:
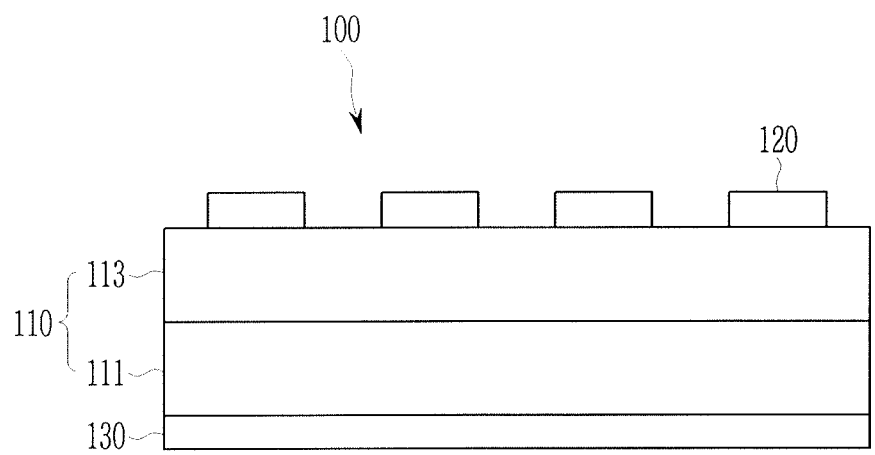
FIG. 1 illustrates a schematic view showing the structure of a solar cell according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when specific definition is not otherwise provided, "substituted" refers to replacement of at least one hydrogen by a substituent selected from a halogen (F, Cl, Br, or I), a hydroxy group, a C1 to C20 alkoxy group, a nitro group, a cyano group, an amino group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C30 heteroaryl group, or a combination thereof.

As used herein, when specific definition is not otherwise provided, the term "hetero" may refer to one substituted with at least one hetero atom of N, O, S, and P, instead of at least one C in a cyclic substituent.

As used herein, when specific definition is not otherwise provided, "*" indicates a point where the same or different atom or Chemical Formula is linked.

A composition for forming an electrode according to an example embodiment includes a conductive powder, a glass frit, and an organic vehicle.

Hereinafter, each component of the composition for forming an electrode is described in detail.

The composition for forming an electrode may use a metal powder as the conductive powder. The metal powder may include one or more of silver (Ag), gold (Au), palladium (Pd), platinum (Pt), ruthenium (Ru), rhodium (Rh), osmium (Os), iridium (Ir), rhenium (Re), titanium (Ti), niobium (Nb), tantalum (Ta), aluminum (Al), copper (Cu), nickel (Ni), molybdenum (Mo), vanadium (V), zinc (Zn), magnesium (Mg), yttrium (Y), cobalt (Co), zirconium (Zr), iron (Fe), tungsten (W), tin (Sn), chromium (Cr), manganese (Mn), etc. For example, the metal powder may be a silver (Ag) powder.

The particle size of the conductive powder may be a nanometer or micrometer scale. For example, the conductive powder may have a particle size of dozens to several hundred nanometers, or several to dozens of micrometers. In other embodiments, the conductive powder may be a mixture of two or more types of silver powders having different particle sizes.

The conductive powder may have a particle shape of a spherical shape, a sheet-shape, or amorphous. The conductive powder may have an average particle diameter (D50) of about 0.1 μm to about 10 μm, for example about 0.5 μm to about 5 μm. The average particle diameter may be measured using, for example. Model 1064D (CILAS Co., Ltd.) equipment after dispersing the conductive powder in isopropyl alcohol (IPA) at room temperature (about 20° C. to about 25° C.) for 3 minutes via ultrasonication. Within these ranges, the composition may provide low contact resistance and low line resistance.

The conductive powder may be present in an amount of about 60 wt % to about 95 wt %, for example about 70 wt % to about 0 wt % based on a total amount (100 wt %) of the composition for forming an electrode for a solar cell. Within these ranges, deterioration in conversion efficiency due to an increase in resistance may be prevented and hard formation of paste caused by a relative decrease of an organic vehicle may also be prevented.

The glass frit may serve to enhance adhesion force between the conductive powder and the wafer or the substrate and to form silver crystal grains in an emitter region by etching an anti-reflection layer and melting the conductive powder so as to reduce contact resistance during a firing process of the composition for forming an electrode for a solar cell. Further, during the sintering process, the glass frit may be softened and may decrease the firing temperature.

When the area of the solar cell is increased in order to improve solar cell efficiency, there is a possibility that contact resistance of the solar cell may be increased. Thus, it is desirable to minimize the influence on the p-n junction while minimizing series resistance. In addition, the firing temperature may vary within a broad range with increasing use of various wafers having different sheet resistances. It is desirable for the glass frit to secure sufficient thermal stability to withstand a wide range of a firing temperature.

The glass frit may be one or more of lead glass frit and non-lead glass frit that are suitable for use in a composition for forming an electrode for a solar cell.

The glass frit may include one or more metal elements selected from lead (Pb), tellurium (Te), bismuth (Bi), lithium (Li), phosphorus (P), germanium (Ge), gallium (Ga), cerium (Ce), iron (Fe), silicon (Si), zinc (Zn), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al).

The glass frit may be prepared from, for example, oxides of the metal elements by a suitable method. For example, the metal oxides may be obtained by mixing the oxides of the metal elements in a predetermined ratio, melting the mixture, quenching the resultant, and then pulverizing the quenched product. The process of mixing may be performed using a ball mill or a planetary mill. The process of melting may be performed at about 700° C. to about 1300° C. and the quenching may be performed at room temperature (about 20° C. to about 25° C.). The process of pulverizing may be performed using a disk mill or a planetary mill, for example.

The glass frit may have an average particle diameter (D50) of about 0.1 μm to about m, and may be present in an amount of about 0.5 wt % to about 20 wt % based on a total amount (100 wt %) of the composition for forming an electrode for a solar cell. Within these ranges, the glass frit may secure excellent adhesion strength of a solar cell electrode while not deteriorating electrical characteristics of an electrode.

The glass frit may have a spherical shape or an amorphous shape. In an embodiment, two different kinds of glass frits having different transition temperatures may be used. For example, a first glass frit having a transition temperature ranging from greater than or equal to about 200° C. to less than or equal to about 350° C. and a second glass frit having a transition temperature ranging from greater than about 350° C. to less than or equal to about 550° C. may be mixed.

The organic vehicle may include a thickener. In an example embodiment, the thickener may include a structural unit represented by Chemical Formula 1:

[Chemical Formula 1]

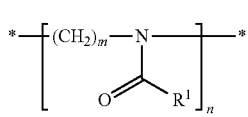

In Chemical Formula 1, $R^1$ may be a substituted or unsubstituted C2 to C30 alkyl group, and the alkyl group terminal end may be represented by *—$CH_3$, m may be an integer ranging from 1 to 3, n may be an integer ranging from 1 to 5, and "*" indicates a point where a same or different atom or Chemical Formula is linked.

In general, a mono-amide or bis-amide-based additive may be used in an effort to realize a thickening effect (due to a hydrogen bond and the like) for a paste composition for printing a front electrode for a solar cell. For example, the thickening additive may be simply added (by adjusting an amount and the like) without separately changing its chemical structure.

Various additives (a binder, a plasticizer, a dispersing agent, and the like) may additionally be used to improve printability, dispersibility, storage stability, and the like. When an amount of the thickener is increased to increase the thickening effect, there may result an increase in residue and the like after the firing, which may, for example, cause a side effect such as a resistance increase during formation of an electrode. In addition, a general thickener may have a molecularly structural limit in precisely controlling a speed of realizing viscoelasticity, closely correlated with the printing characteristics, in addition to the thickening effect.

According to the present example embodiment, printing characteristics (a width decrease, a thickness increase, an aspect ratio increase, and the like) and long-term storage stability may be improved by using a thickener in a paste composition for printing a front electrode for a solar cell, the thickener including at least one amide-bonding structure, which may be formed through a reaction of a fatty acid in the molecular structure.

In an example embodiment, the amide-bonding structure among structural units represented by Chemical Formula 1 included in the thickener may form a network structure through a hydrogen bond with conductive powder such as silver powder and the like, a binder (described further below), a dispersing agent (described further below), a solvent (described further below), and/or the like. For example, when the molecular structure of the thickener includes at least two amide-bonding structures, the network structure may be fortified by a molecular bonding force (a hydrogen bond, a Van der Waals force, and the like), and accordingly, a viscoelasticity effect after the printing may be promoted, and spread prevention of an electrode line width, flatness improvement, storage stability, and the like may be improved. Furthermore, the effect may be maximized by selectively using a thickener having the adjusted number of a structural unit represented by Chemical Formula 1 depending on a paste having viscosity adjusted according to its application use (high viscosity, low viscosity).

In an implementation, $R^1$ may be a substituted or unsubstituted C8 to C30 alkyl group.

The n may be an integer of 2 to 5. When the n is an integer of 1, a network structure may not be easily formed by a molecular bonding force, and thus the n may be an integer of greater than or equal to 2, that is, 2 to 5. In addition, more excellent dissolution may be obtained when the m is an integer of 3.

In an example embodiment, the thickener may be included in an amount of about 0.2 wt % to about 0.3 wt % based on a total amount of the composition for forming an electrode for a solar cell. When the thickener is included within the content range, an effect due to use of the thickener (including a structural unit represented by Chemical Formula 1) may be maximized.

The composition for forming an electrode for a solar cell may further include an organic binder in the organic vehicle.

The organic binder may include, for example, one or more of a cellulose-based compound including a structural unit represented by Chemical Formula 2, a polyacetal compound, or an acryl-based compound.

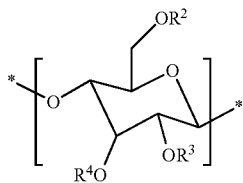

[Chemical Formula 2]

In Chemical Formula 2, $R^2$ to $R^4$ are independently hydrogen, a substituted or unsubstituted C1 to C15 alkyl group, a substituted or unsubstituted C2 to C15 alkenyl group, a substituted or unsubstituted C3 to C20 cycloalkyl group, a substituted or unsubstituted C3 to C20 heterocycloalkyl group, a substituted or unsubstituted C3 to C20 aryl group or a substituted or unsubstituted C3 to C20 heteroaryl group.

When the cellulose-based compound is used as the organic binder, a solar cell having improved efficiency may be provided despite firing at a lower firing temperature than a general firing temperature for manufacturing a solar cell. In addition, when a molecular weight of the organic binder is reduced, an amount of the organic binder may be increased in the composition for forming an electrode, and accordingly, the organic binder may improve a flow behavior and thixotropy of the composition for forming an electrode, and thus improve printability. Accordingly, the composition for forming an electrode including the organic binder may be appropriately used to form an electrode in a solar cell having a PERC (passivated emitter and rear cell) structure (the PERC structured solar cell will be described below).

For example, the cellulose-based compound may be ethyl cellulose. For example, a commercially available ethyl cellulose binder resin (e.g., Ethocel STD series, Dow Chemical Company) may be simply added without separately changing its chemical structure (depending on viscosity/concentration/single/mixture and the like) or modifying it.

The acryl-based compound may be a copolymer of a first ethylenic unsaturated monomer and a second ethylenic unsaturated monomer that is copolymerizable therewith, and may be a resin including at least one acryl-based repeating unit.

The first ethylenic unsaturated monomer may be an ethylenic unsaturated monomer including at least one carboxyl group. Examples of the monomer include (meth) acrylic acid, maleic acid, itaconic acid, fumaric acid, or a combination thereof.

The first ethylenic unsaturated monomer may be included in an amount of about 5 wt % to about 50 wt %, for example about 10 wt % to about 40 wt %, based on a total amount of the acryl-based binder resin.

The second ethylenic unsaturated monomer may be an aromatic vinyl compound such as styrene, α-methylstyrene, vinyl toluene, vinylbenzylmethylether and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated amino alkyl carboxylate ester compound such as 2-aminoethyl(meth) acrylate, 2-dimethylaminoethyl(meth)acrylate, and the like; a carboxylic acid vinyl ester compound such as vinyl acetate, vinyl benzoate, and the like; an unsaturated glycidyl carboxylate ester compound such as glycidyl(meth)acrylate, and the like; a vinyl cyanide compound such as (meth) acrylonitrile and the like; an unsaturated amide compound such as (meth)acrylamide, and the like; and the like, and may be used alone or as a mixture of two or more.

Specific examples of the acryl-based compound may be a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, but are not limited thereto. These may be used alone or as a mixture of two or more.

The binder resin may have a weight average molecular weight (Mw) of about 5,000 g/mol to about 200,000 g/mol.

The composition for forming an electrode for a solar cell may include about 60 wt % to about 95 wt % of the conductive powder; about 0.5 wt % to about 20 wt % of the glass frit; and about 0.1 wt % to about 20 wt % of the organic vehicle based on a total amount of the composition for forming an electrode for a solar cell. The composition for forming an electrode for a solar cell may have appropriate viscosity within the range and thus reduce or prevent adherence deterioration to a substrate and in addition, a resistance increase caused by unsmooth decomposition of an organic binder during the firing, and generation of a crack, an opening, and a pinhole in an electrode and the like.

The solvent may have a boiling point of greater than or equal to about 100° C. and may include one or more of, for example, methyl cellosolve, ethyl cellosolve, butyl cellosolve, aliphatic alcohol, α-terpineol, β-terpineol, dihydroterpineol, ethylene glycol, ethylene glycol monobutyl ether, butyl cellosolve acetate, or 2,2,4-trimethyl-1,3-pentanediol isobutyrate (Texanol).

In an example embodiment, the solvent may be included in a balance amount of the composition for forming an electrode for a solar cell. In an example embodiment, the solvent may be included in an amount of about 1 wt % to about 30 wt % based on a total amount (100 wt %) of the composition for forming an electrode for a solar cell. Within the ranges, sufficient adhesion strength and excellent print characteristics may be secured.

The composition for forming an electrode for a solar cell may further include suitable additives, as desired, to enhance flow properties, process properties, and stability in addition to the constituent elements. The additives may include a surface-treatment agent, a dispersing agent, thixotropic agent, a plasticizer, an antifoaming agent, a pigment, an ultraviolet (UV) stabilizer, an antioxidant, a coupling agent, and the like. These additives may be used alone or as mixtures thereof.

These additives may be included in an amount of about 0.1 to about 5 wt % based on a total amount (100 wt %) of the composition for forming an electrode for a solar cell. The amount of the additive may be selected considering, for example, print characteristics, dispersibility, and storage stability of the composition for forming an electrode for a solar cell.

Another embodiment provides an electrode formed from the composition for forming an electrode for a solar cell.

Another embodiment provides a solar cell including the electrode.

Referring to FIG. 1, a solar cell according to an embodiment is illustrated. FIG. 1 is a schematic view showing the structure of the solar cell according to an embodiment.

Referring to FIG. 1, a solar cell 100 according to the present example embodiment includes a front electrode 120 and a rear electrode 130, one or both of which may be formed by printing the composition for forming an electrode according to an embodiment and then firing the printed composition on a substrate 110 including a p layer (or an n layer) 111 and an n layer (or a p layer) 113 as an emitter.

For example, a prior preparation step for the rear electrode may be performed by printing the electrode composition on the rear surface of the wafer and dried at about 200° C. to about 400° C. for about 10 seconds to about 60 seconds and drying it. In addition, a prior preparation step for the front electrode may be performed by printing the electrode composition on the front surface of the wafer and drying it. Then, the front electrode 120 and the rear electrode 130 may be fired at about 400° C. to about 1,000° C., for example about 600° C. to about 950° C., for about 30 seconds to about 240 seconds.

Figure 2:
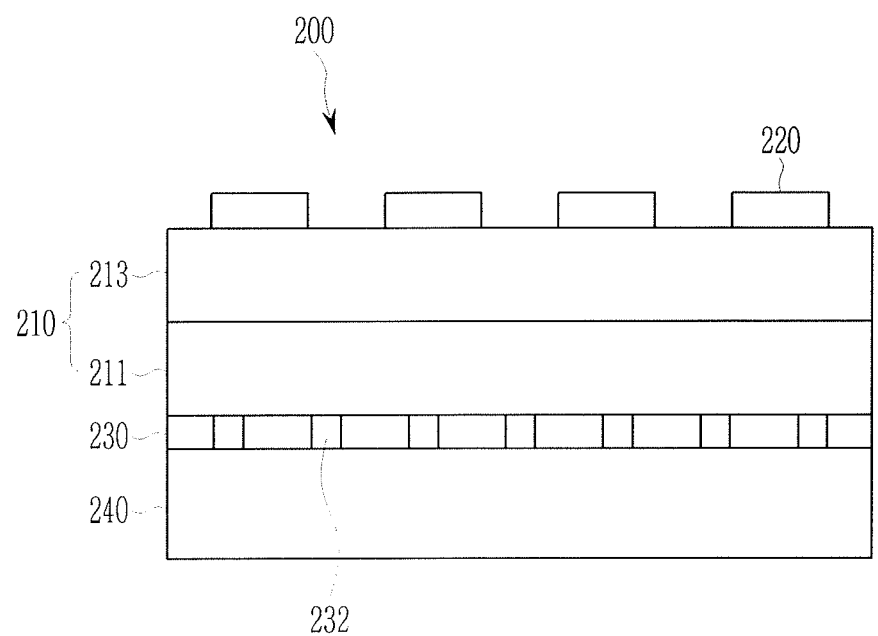
FIG. 2 illustrates a schematic view showing a solar cell having a PERC (passivated emitter and rear cell) structure according to another embodiment.

FIG. 2 is a schematic view showing a solar cell having a PERC (passivated emitter and rear cell) structure according to another embodiment.

Referring to FIG. 2, in a solar cell 200 according to the present example embodiment, a front electrode 220 and a rear electrode 240 may be manufactured by forming a rear passivation layer 230 on a substrate 210 including a p layer (or an n layer) 211 and an n layer (or a p layer) 213 as an emitter, a hole 232 penetrating the rear passivation layer 230, and then, printing the composition for forming an electrode and firing it. The rear passivation layer 230 may be formed of a dielectric material capable of providing an electrical contact between the substrate 210 and the rear electrode 240. This dielectric material may be, for example, an aluminum oxide, a silicon oxide, a silicon nitride, or a mixture thereof. The rear passivation layer 230 may reflect light entering the substrate 210 and thus reduce light absorbed in the rear electrode 240 and resultantly, increase an amount of a current produced thereby.

For example, the composition for forming an electrode may be printing-coated on the rear passivation layer 230 of the substrate 210 and dried at a temperature of about 200° C. to about 400° C. for about 10 seconds to about 60 seconds as a prestep for manufacturing a rear electrode. In addition, the composition for forming an electrode may be printed on the front surface of the substrate and dried as the prestep for manufacturing a front electrode. Subsequently, the coated substrates may be fired at about 400° C. to about 900° C., for example, about 600° C. to about 900° C., for about 30 seconds to 240 seconds to manufacture the front electrode 220 and the rear electrode 240.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Thickener

Synthesis Example 1—Thickener A 150 g of stearic acid (octadecanoic acid,

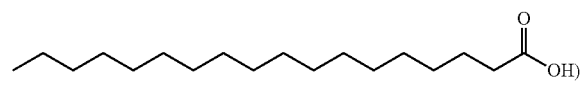

was put in a 1 L round flask and stirred at 80° C. for about 30 minutes to completely melt it, 27 g of tris(3-aminopropyl)amine

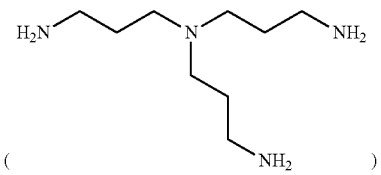 [SMILES: NCCCN(CCCN)CCCN]

was slowly added thereto, and then p-toluenesulfonic acid and oleic acid were additionally added as a catalyst thereto, in which 0.5 parts by weight of the p-toluenesulfonic acid was used based on 100 parts by weight of the oleic acid. The mixture was heated up to 140° C. and then amidated for one hour to obtain Thickener A in which a tris(3-aminopropyl) amine was bound to stearic acid by an amide group.

Synthesis Example 2—Thickener B 150 g of stearic acid was put in a 1 L round flask and stirred at 80° C. for about 30 minutes to completely melt it, 34 g of tetrakis(3-aminopropyl)ammonium

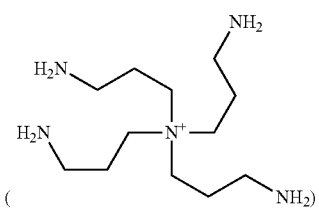

was slowly added, and then p-toluenesulfonic acid and oleic acid were additionally added as a catalyst thereto, in which 0.5 parts by weight of the p-toluenesulfonic acid was used based on 100 parts by weight of the oleic acid. The mixture was heated up to 140° C. and then amidated for 1 hour to obtain Thickener B in which a tetrakis (3-aminopropyl) ammonium was bound to stearic acid by an amide group.

Preparation of Composition for Forming Electrode

Example 1

0.5 wt % of an ethyl cellulose binder resin (Ethocel STD series, DOW Chemical Company) was added to 7.5 wt % of Texanol (Eastman Chemical Company) and sufficiently dissolved therein at 60° C., 88.5 wt % of spherical silver powder having an average particle diameter of 2.0 μm (AG-5-11F, Dowa Hightech Co. Ltd.), 3 wt % of Bi—Te-based non-lead glass frit powder having an average particle diameter of 1.0 μm (ABT-1, Asahi Glass Co., Ltd.), 0.2 wt % of the Thickener A according to Synthesis Example 1, 0.1 wt % of a dispersing agent (BYK-102, BYK-Chemie), and 0.2 wt % of a thixotropic agent (Thixatrol ST, Elementis Co.) were added thereto, and the mixture was mixed and dispersed with a 3 roll mill to prepare a composition for forming an electrode for a solar cell.

Example 2

A composition for forming an electrode for a solar cell was prepared according to the same method as Example 1 except for using the Thickener B according to Synthesis Example 2 instead of the thickener A according to Example 1.

Example 3

A composition for forming an electrode for a solar cell was prepared according to the same method as Example 1 except for changing an amount of the Thickener A according to Example 1 to 0.3 wt %.

Example 4

A composition for forming an electrode for a solar cell was prepared according to the same method as Example 1 except for changing an amount of the Thickener A according to Example 1 to 0.1 wt %.

Example 5

A composition for forming an electrode for a solar cell was prepared according to the same method as Example 1 except for changing an amount of the Thickener A according to Example 1 to 0.4 wt %.

Comparative Example 1

A composition for forming an electrode for a solar cell was prepared according to the same method as Example 1 except for using N,N-ethylenebis(stearamide)

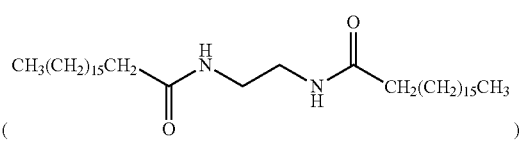

(Sigma-Aldrich Co., Ltd.) instead of the Thickener A.

Comparative Example 2

A composition for forming an electrode for a solar cell was prepared according to the same method as Example 1 except for using stearamide

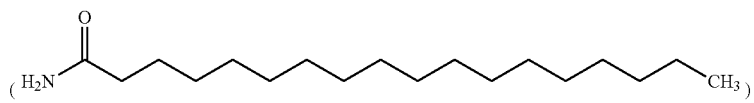 [SMILES: CCCCCCCCCCCCCCCCCC(N)=O]

(Tokyo Chemical Industry) instead of the Thickener A.

Manufacture of Cells

The compositions for forming an electrode according to Examples 1 to 5 and Comparative Examples 1 and 2 were respectively screen-printed on the front surface of a p-type polysilicon wafer for PERC (REC Wafer Pte Ltd., Singapore) by using a screen mask to print an electrode pattern (a finger bar) and, dried by using an infrared ray drying furnace. Subsequently, a composition for forming an electrode including aluminum (RX-8252X-2, Ruxing) was printed on the rear surface of the p-type polysilicon wafer, dried within a temperature range of 200 to 400° C. for 30 seconds in a belt-type furnace for 30 seconds, and then fired within a temperature range of 400° C. to 800° C. for 40 seconds to fabricate a cell for a solar cell.

Evaluation

An EL tester (MV Tech Inc.) was used to count the number of line openings in order to check whether the front electrodes according to Examples 1 to 5 and Comparative Examples 1 and 2 were disconnected or not. A VK equipment (VK9710, Keyence Corp.) was used to measure a line width and a thickness of electrode lines. A solar cell efficiency-measuring equipment (CT-801, Pasan Measurement Systems) was used to measure efficiency. Results are shown in Table 1, below.

(Screen mask: SUS325 type/Emulsion thickness: 15 μm/Finger bar: a line width of 45 μm, 80 in number)

TABLE 1

|  | Ex. 1 | Ex. 2 | Ex. 3 | Ex. 4 | Ex. 5 | Comp. Ex. 1 | Comp. Ex. 2 |
|---|---|---|---|---|---|---|---|
| Line width after firing (μm) | 59 | 62 | 60 | 66 | 69 | 80 | 89 |
| Thickness after firing (μm) | 19 | 19 | 18 | 17 | 16 | 14 | 12 |
| Aspect ratio (thickness/line width) | 0.32 | 0.31 | 0.30 | 0.26 | 0.17 | 0.17 | 0.13 |
| Printability (number of disconnected lines) | 0 | 2 | 0 | 3 | 8 | 11 | 19 |
| Efficiency (%) | 20.3 | 19.8 | 20.1 | 19.5 | 18.7 | 16.2 | 15.4 |

Referring to Table 1, each electrode respectively fabricated using the compositions including the thickener including a structural unit represented by Chemical Formula 1 according to Examples 1 to 3 realized a fine line width, high printability, and a low disconnection generation rate, as compared with the electrodes respectively fabricated using the compositions according to Comparative Examples 1 and 2 and as compared with the electrodes respectively fabricated using the compositions according to Examples 4 and 5. In addition, test cells respectively including the electrodes fabricated using the compositions for forming an electrode for a solar cell according to Examples 1 to 5 showed significantly improved efficiency compared with test cells respectively including the electrodes fabricated using the compositions for forming an electrode for a solar cell according to Comparative Examples 1 and 2.

By way of summation and review, electrodes of a solar cell may be formed with predetermined patterns on a surface of a substrate by applying a composition for forming an electrode, and patterning and firing the same.

Conversion efficiency of a solar cell may be improved by improving contact properties of electrodes with the substrate, and thus minimizing contact resistance ($R_c$) and series resistance ($R_s$) or adjusting pattern line widths of a screen mask with an organic material to be smaller, and thus forming fine lines and increasing a short-circuit current ($I_{sc}$). However, the method of reducing line widths of the electrode pattern with the screen mask may lead to increasing series resistance ($R_s$) and deteriorating continuous printability of a fine pattern.

An electrode composition may include an organic vehicle to impart suitable viscosity and rheological characteristics for printing. The organic vehicle may include an organic binder and a solvent. The amount of the organic binder may be increased or a polymer having high molecular weight may be used in order to increase dispersibility and storage stability. When the amount of the organic binder is increased, resistance may also be increased during formation of an electrode, and when the organic binder having high molecular weight is used, a tailing phenomenon and a printing defect may increase due to increased viscosity even at a high shear rate.

As described above, embodiments may provide a composition for forming an electrode, which may show excellent electrical resistivity characteristics and printing characteristics, and realize an electrode pattern with a high aspect ratio at a high resolution.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

<Description of Symbols>

| 100, 200: solar cell | 120, 220: front electrode |
|---|---|
| 130, 230: rear electrode | 111, 211: p layer (or n layer) |
| 113, 213: n layer (or p layer) | 110, 210: substrate |
| 230: rear passivation layer | 232: hole |

What is claimed is:

1. A composition for forming an electrode for a solar cell, the composition comprising:
   a conductive powder;
   a glass frit; and
   an organic vehicle, the organic vehicle including a thickener including either a tertiary amine or a quaternary ammonium coupled to an amide-containing structural unit represented by Chemical Formula 1:

[Chemical Formula 1]

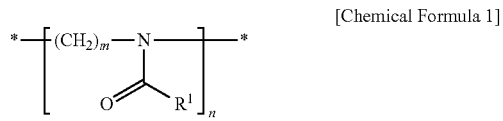

wherein, in Chemical Formula 1,
$R^1$ is a substituted or unsubstituted C2 to C30 alkyl group,
m is an integer ranging from 1 to 3, and
n is an integer ranging from 1 to 5.

2. The composition as claimed in claim 1, wherein $R^1$ is a substituted or unsubstituted C8 to C30 alkyl group.

3. The composition as claimed in claim 1, wherein n is an integer ranging from 2 to 5.

4. The composition as claimed in claim 1, wherein the thickener is included in an amount of about 0.2 wt % to about 0.3 wt % based on a total weight of the composition.

5. The composition as claimed in claim 1, wherein the organic vehicle further includes a binder resin and a solvent.

6. The composition as claimed in claim 5, wherein the binder resin includes one or more of a cellulose-based compound, a polyvinylacetal compound, or an acryl-based compound.

7. The composition as claimed in claim 5, wherein the binder resin has a weight average molecular weight of about 5,000 g/mol to about 200,000 g/mol.

8. The composition as claimed in claim 5, wherein the solvent includes one or more of 2-methoxyethanol, 2-ethoxyethanol, 2-butoxyethanol, aliphatic alcohol, α-terpineol, β-terpineol, dihydro-terpineol, ethylene glycol, ethylene glycol mono butyl ether, butyl cellosolve acetate, or 2,2,4-trimethyl-1,3-pentanediol isobutyrate.

9. The composition as claimed in claim 1, wherein the conductive powder is a silver powder.

10. The composition as claimed in claim 1, wherein the composition includes about 60 wt % to about 95 wt % of the conductive powder; about 0.5 wt % to about 20 wt % of the glass frit; and about 0.1 wt % to about 20 wt % of the organic vehicle.

11. The composition as claimed in claim 1, wherein the glass frit includes one or more of lead, tellurium, bismuth, lithium, phosphorus, germanium, gallium, cerium, iron, silicon, zinc, tungsten, magnesium, cesium, strontium, molybdenum, titanium, tin, indium, vanadium, barium, nickel, copper, sodium, potassium, arsenic, cobalt, zirconium, manganese, and aluminum.

12. The composition as claimed in claim 1, wherein the composition further includes one or more of a surface-treatment agent, a dispersing agent, a thixotropic agent, a plasticizer, an antifoaming agent, a pigment, an ultraviolet stabilizer, an antioxidant, or a coupling agent.

13. A solar cell electrode manufactured using the composition as claimed in claim 1.

14. A solar cell comprising the electrode as claimed in claim 13.

15. The solar cell as claimed in claim 14, wherein the solar cell has a passivated emitter and rear cell structure.

* * * * *